United States Patent
Liu et al.

(10) Patent No.: US 10,903,242 B2
(45) Date of Patent: Jan. 26, 2021

(54) ARRAY SUBSTRATE, MANUFACTURING METHOD, DISPLAY PANEL FOR FORMING TRANSPARENT CONDUCTIVE LAYERS OF DIFFERENT THICKNESSES

(71) Applicant: BOE TECHNOLOGY GROUP CO., LTD., Beijing (CN)

(72) Inventors: Wei Liu, Beijing (CN); Wei Li, Beijing (CN); Ying Han, Beijing (CN); Jianye Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/403,230

(22) Filed: May 3, 2019

(65) Prior Publication Data

US 2020/0105797 A1 Apr. 2, 2020

(30) Foreign Application Priority Data

Sep. 27, 2018 (CN) ............................ 2018 1 1132474

(51) Int. Cl.
*H01L 27/12* (2006.01)
*H01L 51/50* (2006.01)
*H01L 51/52* (2006.01)

(52) U.S. Cl.
CPC ...... *H01L 27/1218* (2013.01); *H01L 27/1262* (2013.01); *H01L 51/5012* (2013.01); *H01L 51/5218* (2013.01)

(58) Field of Classification Search
CPC combination set(s) only.
See application file for complete search history.

(56) References Cited

U.S. PATENT DOCUMENTS

| 2008/0174239 | A1 | 7/2008 | Yoo et al. | |
|---|---|---|---|---|
| 2010/0084642 | A1* | 4/2010 | Hanari | H01L 27/3269 257/40 |
| 2014/0027726 | A1* | 1/2014 | Choi | H01L 33/08 257/40 |

(Continued)

FOREIGN PATENT DOCUMENTS

| CN | 103000662 | 3/2013 |
|---|---|---|
| CN | 103022049 | 4/2013 |

(Continued)

OTHER PUBLICATIONS

1st Office Action dated Mar. 18, 2020 for Chinese Patent Application No. 201811132474.6.

*Primary Examiner* — Nduka E Ojeh

(74) *Attorney, Agent, or Firm* — Thomas | Horstemeyer, LLP

(57) ABSTRACT

The present disclosure relates to the field of display technologies, and provides an array substrate. The array substrate includes a plurality of pixel units distributed in an array, each of the pixel units includes a plurality of sub-pixels, and each of the sub-pixels includes at least one metal layer and a light emitting layer. At least one of the sub-pixels further includes a reflective anode layer formed in the same layer as one of the at least one metal layer, where the reflective anode layer has a transparent conductive layer at a side of the reflective anode layer adjacent to the light emitting layer, and transparent conductive layers of at least two different sub-pixels have different thicknesses.

10 Claims, 4 Drawing Sheets

(56) References Cited

U.S. PATENT DOCUMENTS

| | | | | |
|---|---|---|---|---|
| 2014/0183464 A1* | 7/2014 | Baek | ............... | H01L 27/3213 |
| | | | | 257/40 |
| 2015/0014661 A1* | 1/2015 | Joo | ............... | H01L 51/5036 |
| | | | | 257/40 |
| 2017/0148366 A1* | 5/2017 | Hsin | ............... | H01L 27/3213 |

FOREIGN PATENT DOCUMENTS

| | | |
|---|---|---|
| CN | 103681773 | 3/2014 |
| CN | 107293554 | 10/2017 |

* cited by examiner

ARRAY SUBSTRATE, MANUFACTURING METHOD, DISPLAY PANEL FOR FORMING TRANSPARENT CONDUCTIVE LAYERS OF DIFFERENT THICKNESSES

CROSS-REFERENCE TO RELATED APPLICATION

This application claims the benefit of and priority to Chinese Patent Application No. 201811132474.6, filed on Sep. 27, 2018, the contents of which being incorporated by reference in their entirety herein.

TECHNICAL FIELD

The present disclosure relates to the field of display technology, and more particularly to an array substrate, a manufacturing method, and a display panel.

BACKGROUND

In the development of a large-size AMOLED (Active-matrix Organic Light emitting Diode) or an active-matrix organic light emitting diode (OLED) display panel, top emission technology can be utilized to improve the resolution of the display panel. Therefore, the technical solution is increasingly being studied. In a top emission technology scheme, a pass rate of light waves of different wavelengths can be obtained by adjusting a length of a sub-pixel microcavity structure, and the lengths of the microcavity structures of different sub-pixels can be adjusted to improve the color gamut of the display panel.

In the related art, the length of the sub-pixel microcavity structure is generally adjusted by adjusting a thickness of a transparent conductive layer on a side of a reflective anode layer facing a light emitting layer in a sub-pixel.

However, in the related art, when the length of the microcavity structure is adjusted by adjusting the thickness of the transparent conductive layer, it requires depositing a transparent conductive layer for a plurality of times and performing a plurality of patterning processes to achieve the adjustment of the length of the microcavity structure. This increases the number of process steps and costs, and may result in a decreased yield.

It should be noted that the information disclosed in the Background section above is only for enhancement of understanding of the background of the present disclosure, and thus may include information that does not constitute prior art known to those of ordinary skill in the art.

SUMMARY

An objective of the present disclosure is to provide an array substrate, a manufacturing method thereof, and a display panel, so as to at least overcome the technical problem of complicated processes caused by forming transparent conductive layers of different thickness on the reflective anode layers of different sub-pixels in the related art.

According to an aspect of the present disclosure, an array substrate is provided. The array substrate includes a plurality of pixel units distributed in an array, each of the pixel units includes a plurality of sub-pixels, and each of the sub-pixels includes at least one metal layer and a light emitting layer. At least one of the sub-pixels further includes a reflective anode layer formed in the same layer as one of the metal layer. The reflective anode layer has a transparent conductive layer at a side of the reflective anode layer adjacent to the light emitting layer, and transparent conductive layers of at least two different sub-pixels have different thicknesses.

In an exemplary embodiment of the present disclosure, the at least one metal layer includes: a light shielding metal layer, a gate metal layer, and a source/drain metal layer.

In an exemplary embodiment of the present disclosure, the pixel unit includes a first sub-pixel, where the first sub-pixel includes a first reflective anode layer formed in the same layer as the light shielding metal layer, and the first reflective anode layer has a first transparent conductive layer having a first thickness on a side of the first reflective anode layer adjacent to the light emitting layer.

In an exemplary embodiment of the present disclosure, the pixel unit includes a second sub-pixel, where the second sub-pixel includes a second reflective anode layer formed in the same layer as the gate metal layer, and the second reflective anode layer has a second transparent conductive layer having a second thickness on a side of the second reflective anode layer adjacent to the light emitting layer.

In an exemplary embodiment of the present disclosure, the pixel unit includes a third sub-pixel, where the third sub-pixel includes a third reflective anode layer formed in the same layer as the source/drain metal layer, and the third reflective anode layer has a third transparent conductive layer having a third thickness on a side of the third reflective anode layer adjacent to the light emitting layer.

In an exemplary embodiment of the present disclosure, the transparent conductive layer has a thickness of 120 angstroms to 820 angstroms.

According to an aspect of the present disclosure, a method for manufacturing an array substrate is provided. The array substrate includes a plurality of pixel units distributed in an array, each of the pixel units includes a plurality of sub-pixels, and each of the sub-pixels includes at least one metal layer and a light emitting layer. The method includes: forming a reflective anode layer of at least one of the sub-pixels in the same layer as the metal layer, the reflective anode layer having a transparent conductive layer on a side of the reflective anode layer adjacent to the light emitting layer, and transparent conductive layers of at least two different sub-pixels having different thicknesses.

In an exemplary embodiment of the present disclosure, at least one of the metal layers includes a light shielding metal layer, the pixel unit includes a first sub-pixel, and the method includes: forming a first reflective anode layer of the first sub-pixel in the same layer as the light shielding metal layer, wherein the first reflective anode layer has a first transparent conductive layer of a first thickness on a side of the first reflective anode layer adjacent to the light emitting layer.

In an exemplary embodiment of the present disclosure, at least one of the metal layers includes a gate metal layer, the pixel unit includes a second sub-pixel, and the method includes: forming a second reflective anode layer of the second sub-pixel in the same layer as the gate metal layer, wherein the second reflective anode layer has a second transparent conductive layer of a second thickness on a side of the second reflective anode layer adjacent to the light emitting layer.

In an exemplary embodiment of the present disclosure, at least one of the metal layers includes a source/drain metal layer, the pixel unit includes a third sub-pixel, and the method includes: forming a third reflective anode layer of the third sub-pixel in the same layer as the source/drain metal layer, wherein the third reflective anode layer has a third transparent conductive layer of a third thickness on a side of the third reflective anode layer adjacent to the light emitting layer.

In an exemplary embodiment of the present disclosure, the pixel unit includes a first sub-pixel, a second sub-pixel, and a third sub-pixel, at least one of the metal layers includes a light shielding metal layer, a gate metal layer, and a source/drain metal layer, and the method includes: forming a first reflective anode layer of the first sub-pixel in the same layer as the light shielding metal layer, wherein the first reflective anode layer has a first transparent conductive layer of a first thickness on a side of the first reflective anode layer adjacent to the light emitting layer; forming a second reflective anode layer of the second sub-pixel in the same layer as the gate metal layer, wherein the second reflective anode layer has a second transparent conductive layer of a second thickness on a side of the second reflective anode layer adjacent to the light emitting layer; and forming a third reflective anode layer of the third sub-pixel in the same layer as the source/drain metal layer, wherein the third reflective anode layer has a third transparent conductive layer of a third thickness on a side of the third reflective anode layer adjacent to the light emitting layer.

In an exemplary embodiment of the present disclosure, forming a first reflective anode layer of the first sub-pixel in the same layer as the light shielding metal layer includes: forming a first anode material layer on the base substrate, wherein the first anode material layer includes a transparent conductive layer of a first thickness on a side of the first anode material layer facing away from the base substrate; forming a portion of the first anode material layer into the light shielding metal layer; and forming a portion of the first anode material layer into the first reflective anode layer.

In an exemplary embodiment of the present disclosure, the method further includes: forming a buffer layer on the light shielding metal layer, the first reflective anode layer, and a portion of the base substrate; and forming an active layer on a portion of the buffer layer.

In an exemplary embodiment of the present disclosure, forming a second reflective anode layer of the second sub-pixel in the same layer as the gate metal layer includes: forming a gate insulating material layer on a portion of the active layer and a portion of the buffer layer; forming a second anode material layer on the gate insulating material layer, the second anode material layer including a transparent conductive layer of a second thickness on a side of the second anode material layer facing away from the base substrate; forming a portion of the second anode material layer into the gate metal layer; and forming a portion of the second anode material layer into the second reflective anode layer.

In an exemplary embodiment of the present disclosure, the method further includes: forming an interlayer dielectric layer on the second anode material layer; forming a first via hole for connecting source and drain electrodes and the active layer on the interlayer dielectric layer; forming a second via hole for connecting the light shielding metal layer and one of the source and drain electrodes on the interlayer dielectric layer; forming a third via hole for connecting the first reflective anode layer and one of the source and drain electrodes on the interlayer dielectric layer; and forming a fourth via hole for connecting the second reflective anode layer and one of the source and drain electrodes on the interlayer dielectric layer.

In an exemplary embodiment of the present disclosure, forming a third reflective anode layer of the third sub-pixel in the same layer as the source/drain metal layer includes: forming a third anode material layer on the interlayer dielectric layer, wherein the third anode material layer includes a transparent conductive layer of a third thickness on a side of the third anode material layer facing away from the base substrate; and forming a portion of the third anode material layer into the source/drain metal layer; and forming a portion of the third anode material layer into the third reflective anode layer.

In an exemplary embodiment of the present disclosure, the method further includes: forming a passivation layer on the third anode material layer; forming a pixel defining layer on the passivation layer, the pixel defining layer including an opening for disposing an electroluminescent device, the opening being disposed over the first reflective anode layer, the second reflective anode layer, and the third reflective anode layers; and forming a fifth via hole on the opening for exposing the first reflective anode layer, the second reflective anode layer, and the third reflective anode layer.

According to an aspect of the present disclosure, a display panel is provided, including the array substrate described above.

In the array substrate, the manufacturing method and the display panel provided by embodiments of the present disclosure, the reflective anode layer and the metal layer on the sub-pixel are formed in the same layer. On one hand, in the array substrate provided by the present disclosure, transparent conductive layers of different thicknesses can be formed on the reflective anode layers of different sub-pixels without increasing the number of process steps. On the other hand, in the present disclosure, the transparent conductive layer of the array substrate can be formed at one time, thereby reducing the probability of occurrence of defective products.

It should be understood that both the foregoing general description and the following detailed description are exemplary and explanatory only and are not intended to limit the disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the disclosure. Understandably, the drawings in the following description are only some embodiments of the present disclosure. Other drawings may also be obtained from these drawings by those of ordinary skill in the art based on these drawings without creative labor.

DETAILED DESCRIPTION

Figure 1:
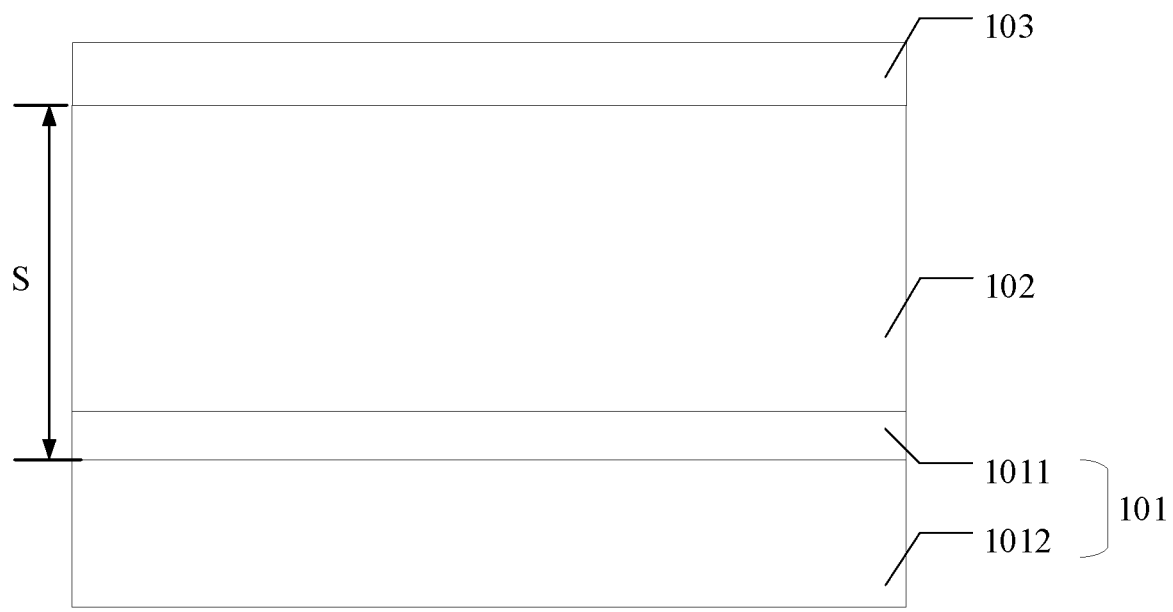
FIG. 1 is a schematic structural diagram of an electroluminescent device of a sub-pixel in the related art.

Exemplary embodiments will now be described more fully with reference to the accompanying drawings. However, the exemplary embodiments can be embodied in a variety of forms and should not be construed as being limited to the examples set forth herein; rather, these embodiments are provided so that this disclosure will be more complete and thorough, and to fully convey the concept of the exemplary embodiments to those skilled in the art. The same reference numerals in the drawings denote the same or similar structures, and thus their detailed description will be omitted.

Although the relative terms such as "upper" and "lower" are used in the specification to describe the relative relationship of one component to another component as illustrated, these terms are used in this specification for convenience in description only, for example, according to the direction of the example illustrated in the accompanying drawings. It will be understood that if the device illustrated is flipped upside down, the component described as "upper" will become the component "below". Other relative terms, such as "high", "low", "top", "bottom", "left", "right", etc., also have similar meanings. When a structure is "on" another structure, it may mean that a structure is integrally formed on the other structure, or that a structure is "directly" disposed on the other structure, or that a structure is "indirectly" disposed on the other structure through other structure(s).

The terms "a", "an", and "the" are used to mean the presence of one or more elements/components, etc.; the terms "including" and "having" are used to mean the meaning of nonexclusive inclusion, and that additional elements/components/etc. may be present in addition to the listed elements/components/etc.

Figure 2:
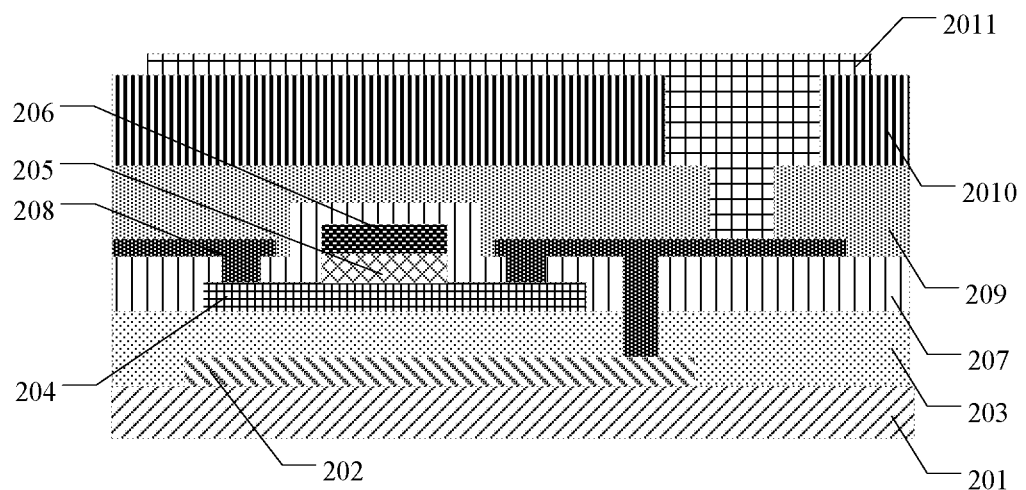
FIG. 2 is a schematic structural diagram of an array substrate in the related art.

FIG. 1 is a schematic structural diagram of an electroluminescent device of a sub-pixel in the related art. As can be seen from FIG. 1, the electroluminescent device mainly includes a reflective anode layer 101, a functional layer 102 (including a hole injection layer, a light emitting layer, an electron injection layer, etc.), and a semi-reflective cathode layer 103. The reflective anode layer 101 may include a transparent conductive layer 1011 and a reflective metal layer 1012 facing a side of the light emitting layer. A microcavity structure may be formed between the reflective metal layer 1012 and the semi-reflective cathode layer 103. The microcavity structure may allow only light of a specific wavelength to be emitted out at a specific angle if the light conforms to the resonant mode of the microcavity structure. For example, the light emitted by the electroluminescent device in the R sub-pixel resonates in the resonant mode of the microcavity structure, so that light of a wavelength corresponding to red light is emitted at a specific angle; the light emitted by the electroluminescent device in the G sub-pixel resonates in the resonant mode of the microcavity structure, so that light of a wavelength corresponding to green light is emitted at a specific angle; and the light emitted by the electroluminescent device in the B sub-pixel resonates in the resonant mode of the microcavity structure, so that light of a wavelength corresponding to blue light is emitted at a specific angle. By adjusting the length S of the microcavity structure of each sub-pixel, the transmittance of the specified wavelength light in the sub-pixel can be improved, thereby increasing the color gamut of the entire display panel. Adjusting the length of the microcavity structure can be achieved by adjusting the thickness of the functional layer 102 and the transparent conductive layer 1011. However, the change of the functional layer 102 may decrease the service life and efficiency of the electroluminescent device. Thus, in the related art, the length of the microcavity is generally adjusted by changing the thickness of the transparent conductive layer 1011. FIG. 2 is a schematic structural diagram of an array substrate in the related art. In the related art, the array substrate mainly includes a base substrate 201, a light shielding metal layer 202, a buffer layer 203, an active layer 204, a gate insulating layer 205, a gate electrode 206, an interlayer dielectric layer 207, a source/drain electrode 208, a passivation layer 209, a planarization layer 2010, and a reflective anode layer 2011. In the related art, the reflective anode layer of each sub-pixel is formed on the planarization layer 2010 in the same layer. To form transparent conductive layers of different thicknesses on the reflective anode layers of different sub-pixels, it is necessary to deposit a transparent conductive layer and perform a patterning process for a plurality of times. However, the process of depositing a transparent conductive layer and performing a patterning process for a plurality of times makes the process complicated and causes a decreased yield.

In view of the foregoing, an exemplary embodiment provides an array substrate. The array substrate includes a plurality of pixel units distributed in an array. Each of the pixel units includes a plurality of sub-pixels, and each of the sub-pixels includes at least one metal layer and a light emitting layer. At least one of the sub-pixels also includes a reflective anode layer formed in the same layer as one of the metal layers; and the reflective anode layer has a transparent conductive layer on a side adjacent to the light emitting layer. Transparent conductive layers of at least two different sub-pixels have different thicknesses. Here, the term "being (are) formed in the same layer" means being formed in the same patterning process.

The present exemplary embodiment provides an array substrate in which the reflective anode layer and the metal layer on the sub-pixel are formed in the same layer. On one hand, in the array substrate provided by the present disclosure, transparent conductive layers of different thicknesses can be formed on the reflective anode layers of different sub-pixels without increasing the number of process steps. On the other hand, in the present disclosure, the transparent conductive layer of the array substrate can be formed at one time, thereby reducing the probability of occurrence of defective products.

Figure 3:
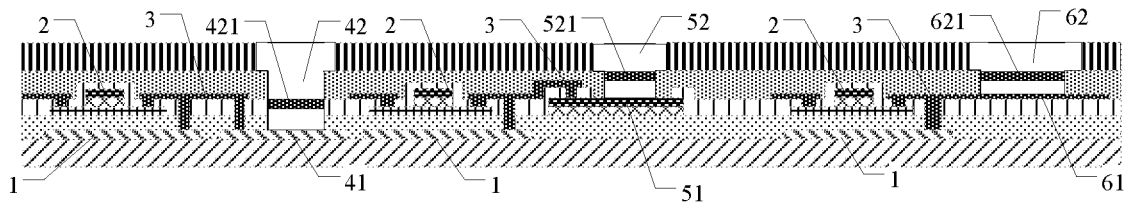
FIG. 3 is a schematic structural diagram of an array substrate according to an exemplary embodiment of the present disclosure.

FIG. 3 is a schematic structural diagram of an array substrate according to an exemplary embodiment of the present disclosure. In the exemplary embodiment, at least one of the metal layers may include a light shielding metal layer 1, a gate metal layer 2, and a source/drain metal layer 3. The pixel unit may include a first sub-pixel, a second sub-pixel, and a third sub-pixel. The first sub-pixel includes a first reflective anode layer 41 formed in the same layer as the light shielding metal layer 1. A functional layer 42 is disposed on first reflective anode layer 41. The functional layer 42 includes a light emitting layer 421 therein. The first reflective anode layer 41 has a first transparent conductive layer having a first thickness on a side of the first reflective anode layer 41 adjacent to the light emitting layer 421. The second sub-pixel includes a second reflective anode layer 51 formed in the same layer as the gate metal layer 2. A functional layer 52 is disposed on second reflective anode layer 51. The functional layer 52 includes a light emitting layer 521 therein. The second reflective anode layer 51 has a second transparent conductive layer having a second thickness on a side of the second reflective anode layer 51 adjacent to the light emitting layer 521. The third sub-pixel includes a third reflective anode layer 61 formed in the same layer as the source/drain metal layer 3. A functional layer 62 is disposed on third reflective anode layer 61. The functional layer 62 includes a light emitting layer 621 therein. The second reflective anode layer 61 has a third transparent conductive layer having a third thickness on a side of the third reflective anode layer 61 adjacent to the light emitting layer 621. The first thickness, the second thickness, and the third thickness may be set as different values. Thus, the present exemplary embodiment can achieve transparent conductive layers of different thicknesses in the three sub-pixels without increasing the number of process steps. It should be understood that, in other exemplary embodiments, the metal layer may also be another metal structure layer, the pixel unit may include four sub-pixels, and only some of the sub-pixels have the reflective anode layers formed in the same layer as the metal layer. It is possible that only a part of the first thickness, the second thickness, and the third thickness is different from other thicknesses. For example, the first thickness is different from the second thickness, but the first thickness may be the same as the third thickness; or the second thickness may be the same as the third thickness; for example, the first thickness may be different from the third thickness, but the first thickness may be the same as the second thickness; or the third thickness may be the same as the second thickness. All of such implementations are intended to be within the scope of protection of the present disclosure.

Figure 4:
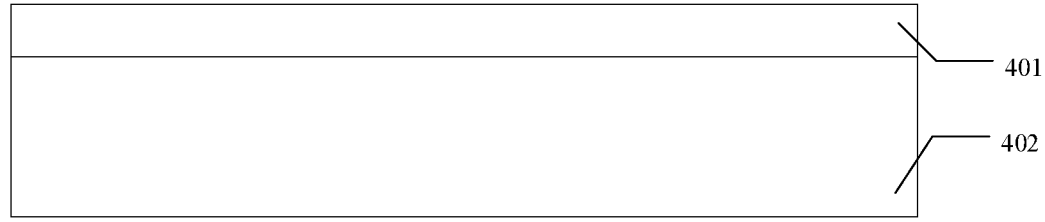
FIG. 4 is a schematic structural diagram of a reflective anode layer of the array substrate in an exemplary embodiment according to the present disclosure.

FIG. 4 is a schematic structural diagram of a reflective anode layer of the array substrate in an exemplary embodiment according to the present disclosure. As shown in FIG. 4, each of the reflective anode layers 41, 51, 61 described above may include a transparent conductive layer 401 and a reflective metal layer 402. The transparent conductive layer may be indium tin oxide (ITO), and the reflective metal layer may be an aluminum neodymium alloy. The light shielding metal layer 1, the gate metal layer 2, and the source/drain metal layer 3 formed in the same layer as the reflective anode layers 41, 51, and 61 described above may have the same structure as the reflective anode layers, and the reflective anode layers can achieve the function of the light shielding metal layer 1, the gate metal layer 2, and the source/drain metal layer 3. It should be understood that in other exemplary embodiments, the reflective anode layer may have one or more other structures. For example, the reflective anode layers may each include a reflective metal layer and a transparent conductive layer on both sides of the reflective metal layer.

In the exemplary embodiment, the transparent conductive layer has a thickness of 120 angstroms to 820 angstroms. The first sub-pixel may be a green sub-pixel, and the first thickness may be 120 angstroms. The second sub-pixel may be a blue sub-pixel, and the second thickness may be 520 angstroms. The third sub-pixel may be a red sub-pixel and the third thickness may be 820 angstroms. This arrangement can achieve the maximum transmittance of light waves corresponding to different sub-pixels.

An exemplary embodiment further provides a method for manufacturing an array substrate. The array substrate includes a plurality of pixel units distributed in an array. Each of the pixel units includes a plurality of sub-pixels, and each of the sub-pixels includes at least one metal a layer and a light emitting layer. The method includes: forming a reflective anode layer of at least one of the sub-pixels in the same layer as the metal layer, wherein the reflective anode layer has a transparent conductive layer on a side of the reflective anode layer adjacent to the light emitting layer, and transparent conductive layers of at least two different sub-pixels have different thicknesses.

In an exemplary embodiment, at least one of the metal layers may include a light shielding metal layer, the pixel unit may include a first sub-pixel, and the method may include: forming a first reflective anode layer of the first sub-pixel in the same layer as the light shielding metal layer, wherein the first reflective anode layer has a first transparent conductive layer of a first thickness on a side of the first reflective anode layer adjacent to the light emitting layer.

In an exemplary embodiment, at least one of the metal layers may include a gate metal layer, the pixel unit may include a second sub-pixel, and the method may include: forming a second reflective anode layer of the second sub-pixel in the same layer as the gate metal layer, wherein the second reflective anode layer has a second transparent conductive layer of a second thickness on a side of the second reflective anode layer adjacent to the light emitting layer.

In an exemplary embodiment, at least one of the metal layers may include a source/drain metal layer, the pixel unit may include a third sub-pixel, and the method may include: forming a third reflective anode layer of the third sub-pixel in the same layer as the source/drain metal layer, wherein the third reflective anode layer has a third transparent conductive layer of a third thickness on a side of the third reflective anode layer adjacent to the light emitting layer.

In the method for manufacturing an array substrate, the reflective anode layer and the metal layer on the sub-pixel are formed in the same layer. On one hand, in the array substrate provided by the present disclosure, transparent conductive layers of different thicknesses can be formed on the reflective anode layers of different sub-pixels without increasing the number of process steps. On the other hand, in the present disclosure, the transparent conductive layers of the array substrate can each be formed in one patterning process, thereby reducing the probability of occurrence of defective products.

It should be noted that, in the embodiments of FIGS. 5-12 below, one pixel unit includes three pixel sub-pixels, that is, the first to third sub-pixels, a first reflective anode layer of the first sub-pixel is formed in the same layer as the light shielding metal layer in the first sub-pixel, the first reflective anode layer has a first transparent conductive layer of a first thickness on a side of the first reflective anode layer adjacent to the light emitting layer; a second reflective anode layer of the second sub-pixel is formed in the same layer as the gate metal layer, and the second reflective anode layer has a second transparent conductive layer of a second thickness on a side of the second reflective anode layer adjacent to the light emitting layer; and a third reflective anode layer of the third sub-pixel is formed in the same layer as the source/drain metal layer, and the third reflective anode layer has a third transparent conductive layer of a third thickness on a side of the third reflective anode layer adjacent to the light emitting layer. However, the present disclosure is not so limited, as long as a reflective anode layer of at least one sub-pixel in each pixel unit is formed in the same layer as at least one of the metal layers in the corresponding sub-pixel, such arrangement is within the protection scope of the present disclosure.

Figure 5:
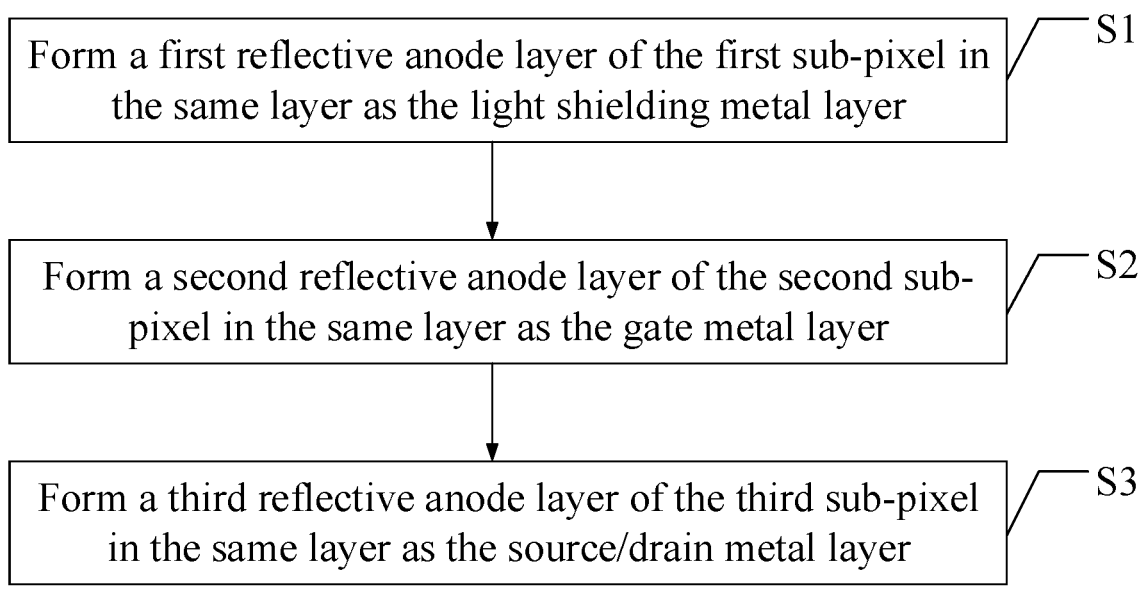
FIG. 5 is a flow chart of a method for manufacturing an array substrate according to an exemplary embodiment of the present disclosure.

In this exemplary embodiment, the pixel unit may include a first sub-pixel, a second sub-pixel, and a third sub-pixel, and at least one of the metal layers may include a light shielding metal layer, a gate metal layer, and a source/drain metal layer, as shown in FIGS. 5-12. FIG. 5 is a flow chart of a method for manufacturing an array substrate according to an exemplary embodiment of the present disclosure, and FIGS. 6-12 are schematic diagrams showing structures of an array substrate at stages in a method for manufacturing the array substrate according to an exemplary embodiment of the present disclosure. The manufacturing method of the array substrate may include the following steps.

In step S1, a first reflective anode layer of the first sub-pixel is formed in the same layer as the light shielding metal layer, the first reflective anode layer having a first transparent conductive layer of a first thickness on a side of the first reflective anode layer adjacent to the light emitting layer.

In step S2, a second reflective anode layer of the second sub-pixel is formed in the same layer as the gate metal layer, the second reflective anode layer having a second transparent conductive layer of a second thickness on a side of the second reflective anode layer adjacent to the light emitting layer.

In step S3, a third reflective anode layer of the third sub-pixel is formed in the same layer as the source/drain metal layer, the third reflective anode layer having a third transparent conductive layer of a third thickness on a side of the third reflective anode layer adjacent to the light emitting layer.

It should be understood that, in other exemplary embodiments, the metal layer may also be other metal structure layers; the pixel unit may include four sub-pixels, and only some of the plurality of sub-pixels may be formed in the same layer as the metal layer; it is also possible that only some of the first thickness, the second thickness, and the third thickness differ from other thicknesses, and all such implementations are within the protection scope of the present disclosure.

Each step is described in detail below.

Figure 6:
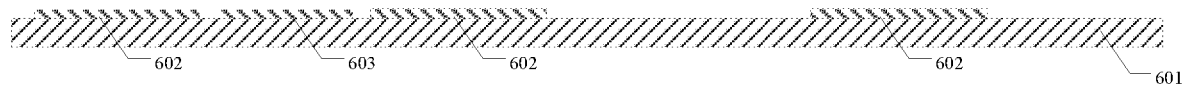
FIGS. 6-12 are schematic diagrams showing structures of an array substrate at stages in a method for manufacturing the array substrate according to an exemplary embodiment of the present disclosure.

In the exemplary embodiment, as shown in FIG. 6, forming a first reflective anode layer of the first sub-pixel in the same layer as the light shielding metal layer may include:

forming a first anode material layer on the base substrate 601, wherein the first anode material layer includes a transparent conductive layer of a first thickness on a side of the first anode material layer away from the base substrate; and forming a portion of the first anode material layer into the light shielding metal layer 602; and forming a portion of the first anode material layer into the first reflective anode layer 603.

The structure of the first anode material layer may be the same as the structure of the reflective anode layer described above, and may include a reflective metal layer and a transparent conductive layer. In the present exemplary embodiment, the reflective metal layer and the transparent conductive layer may be sequentially formed on the base substrate 601 by a process such as deposition, sputtering, or the like. In the present exemplary embodiment, the entire first anode material layer may be formed partly into the light shielding metal layer 602 and partly into the first reflective material layer 603 by a patterning process.

Figure 7:
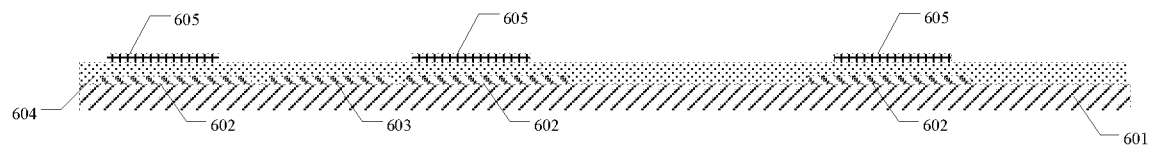

As shown in FIG. 7, in the exemplary embodiment, the method may further include:

forming a buffer layer 604 on the light shielding metal layer 602, the first reflective anode layer 603, and a portion of the base substrate 601; and forming an active layer 605 on a portion of the buffer layer 604.

The buffer layer can be realized by a deposition process, and the buffer layer material can be selected from inorganic materials such as SiOx. The active layer 605 may be disposed above the light shielding metal layer 602, the active layer 605 may be formed by a patterning process, and the active layer may be selected from an indium gallium zinc oxide (IGZO) material.

Figure 8:
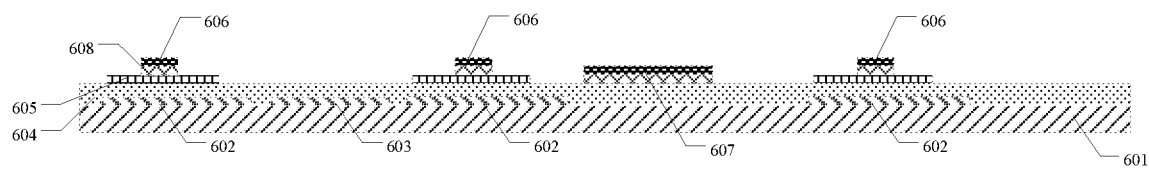

In the exemplary embodiment, as shown in FIG. 8, forming a second reflective anode layer of the second sub-pixel in the same layer as the gate metal layer may include:

forming a gate insulating material layer on the active layer 605 and a portion of the buffer layer 604;

forming a second anode material layer on the gate insulating material layer, wherein the second anode material layer includes a transparent conductive layer of a second thickness on a side of the second anode material layer away from the base substrate; and forming a portion of the second anode material layer into the gate metal layer 606; and forming a portion of the second anode material layer into the second reflective anode layer 607.

The structure of the second anode material layer may be the same as the structure of the reflective anode layer described above, and may include a reflective metal layer and a transparent conductive layer. In the present exemplary embodiment, the reflective metal layer and the transparent conductive layer may be sequentially formed on the gate insulating material layer by a process such as deposition, sputtering, or the like. The gate insulating material layer may be made of an inorganic material such as SiOx. In the present exemplary embodiment, the entire second anode material layer may be formed partly into the second reflective anode layer 607 and partly into the gate metal layer 606 by a patterning process, and the gate insulating layer 608 may be formed in the same patterning process. The second reflective anode layer 607 and the gate metal layer 606 may be formed by wet etching technique, and the gate insulating layer 608 may be formed by a dry etching technique.

Figure 9:
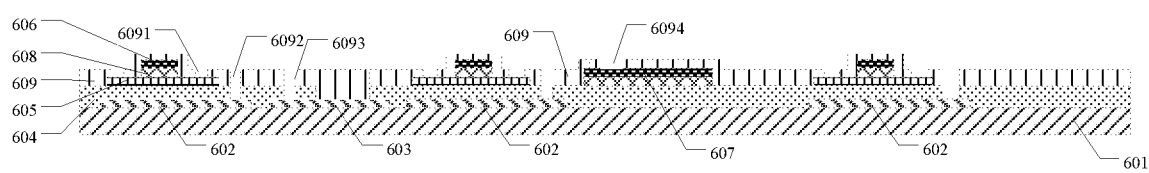

In the exemplary embodiment, as shown in FIG. 9, the method may further include:

forming an interlayer dielectric layer 609 on the second anode material layer;

forming a first via hole 6091 for connecting the source and drain electrodes and the active layer in the interlayer dielectric layer;

forming a second via hole 6092 for connecting the light shielding metal layer and one of the source and drain electrodes in the interlayer dielectric layer;

forming a third via hole 6093 for connecting the first reflective anode layer and one of the source and drain electrodes in the interlayer dielectric layer; and forming a fourth via hole 6094 for connecting the second reflective anode layer and one of the source and drain electrodes in the interlayer dielectric layer.

In the exemplary embodiment, the interlayer dielectric layer 609 may be formed on the second anode material layer by a deposition process, and the first via hole 6091, the second via hole 6092, the third via hole 6093 and the fourth via hole 6094 may be formed in the interlayer dielectric layer 609 by one patterning process.

Figure 10:
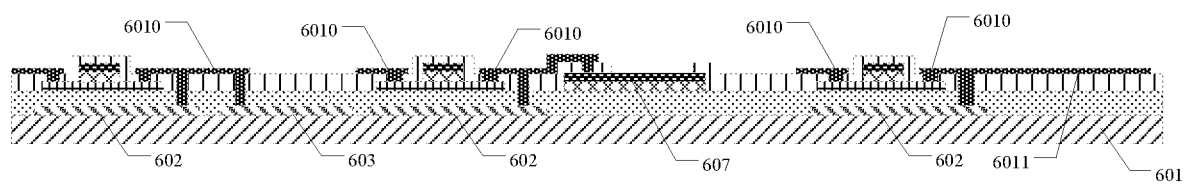

In the exemplary embodiment, as shown in FIG. 10, forming a third reflective anode layer of the third sub-pixel in the same layer as the source/drain metal layer may include:

forming a third anode material layer on the interlayer dielectric layer 609, wherein the third anode material layer includes a transparent conductive layer of a third thickness on a side of the third anode material layer facing away from the base substrate; and forming a portion of the third anode material layer into the source/drain metal layer 6010; and forming a portion of the third anode material layer into the third reflective anode layer 6011.

The structure of the third anode material layer is the same as that of the reflective anode layer described above, and may include a reflective metal layer and a transparent conductive layer. In the present exemplary embodiment, the reflective metal layer and the transparent conductive layer may be sequentially formed on the interlayer dielectric layer 609 by a process such as deposition, sputtering, or the like. In the exemplary embodiment, the entire third anode material layer may be formed partly into the source/drain metal layer 6010 and partly into the third reflective anode layer 6011 by a patterning process. One of the source/drain metal layers 6010 (source or drain) and the three reflective anode layers 6011 are connected.

Figure 11:
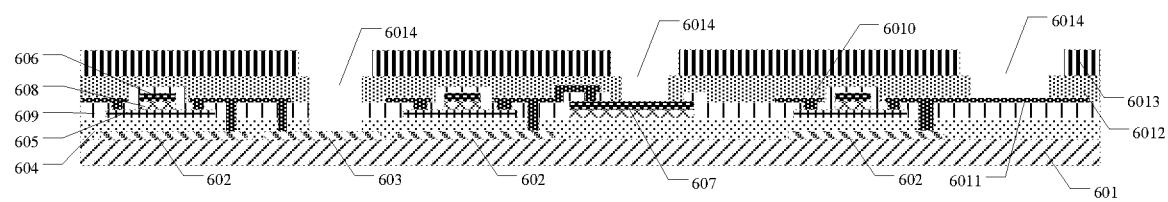

In the exemplary embodiment, as shown in FIG. 11, the method may further include:

forming a passivation layer 6012 on the third anode material layer;

forming a pixel defining layer 6013 on the passivation layer 6012, wherein the pixel defining layer 6013 includes an opening for disposing an electroluminescent device, and the opening is disposed over the first reflective anode layer, the second reflective anode layer, and the third reflective anode layers; and forming a fifth via hole 6014 for exposing the first reflective anode layer, the second reflective anode layer, and the third reflective anode layer on the opening.

Figure 12:
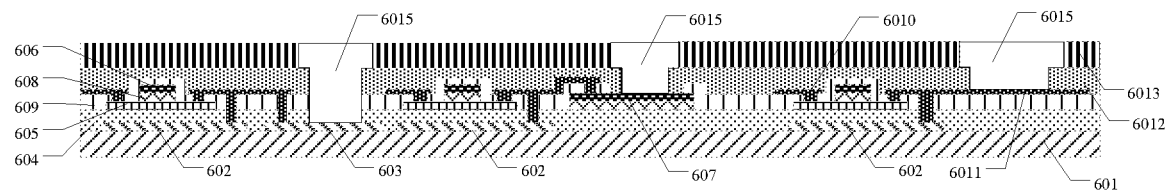

In the exemplary embodiment, as shown in FIG. 12, the method further includes forming an electroluminescent device 6015 in the fifth via hole.

An exemplary embodiment of the present disclosure also provides a display panel including the above array substrate.

The display panel provided by the exemplary embodiment has the same technical features and working principles as the above-mentioned array substrate, and the above content has been described in detail, details of which will not be repeated herein.

Other embodiments of the disclosure will be apparent to those skilled in the art from consideration of the specification and practice of the disclosure disclosed herein. This application is intended to cover any variations, uses, or adaptations of the disclosure following the general principles thereof and include such departures from the present disclosure as within known or customary practice in the art. It is intended that the specification and examples be considered as exemplary only, with a true scope and spirit of the disclosure being indicated by the following claims.

The features, structures, or characteristics described above may be combined in any suitable manner in one or more embodiments, and the features discussed in the various embodiments are interchangeable, if possible. In the description above, numerous specific details are set forth to provide a thorough understanding of the embodiments of the disclosure. However, one skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

What is claimed is:

1. An array substrate, comprising:
   a plurality of pixel units distributed in an array, each of the pixel units comprising a plurality of sub-pixels, each of the sub-pixels comprising at least one metal layer and a light emitting layer,
   wherein at least one of the sub-pixels further comprises a reflective anode layer formed in the same layer as one of the at least one metal layer, the reflective anode layer having a transparent conductive layer at a side of the reflective anode layer adjacent to the light emitting layer, and transparent conductive layers of at least two different sub-pixels having different thicknesses;
   wherein the at least one metal layer comprises: a light shielding metal layer, a gate metal layer, and a source/drain metal layer, the plurality of sub-pixels comprising a first sub-pixel, a second sub-pixel, and a third sub-pixel; and
   wherein a first reflective anode layer of the first sub-pixel is in the same layer as the light shielding metal layer, a second reflective anode layer of the second sub-pixel is in the same layer as the gate metal layer, and a third reflective anode layer of the third sub-pixel is in the same layer as the source/drain metal layer.

2. The array substrate according to claim 1, wherein the transparent conductive layer has a thickness of 120 angstroms to 820 angstroms.

3. A method for manufacturing an array substrate, the array substrate comprising a plurality of pixel units distributed in an array, each of the pixel units comprising a plurality of sub-pixels, and each of the sub-pixels comprising at least one metal layer and a light emitting layer; wherein the method comprises:
   forming a reflective anode layer of at least one of the sub-pixels in the same layer as the metal layer, the reflective anode layer having a transparent conductive layer on a side of the reflective anode layer adjacent to the light emitting layer, and transparent conductive layers of at least two different sub-pixels having different thicknesses, wherein each of the pixel units comprises a first sub-pixel, a second sub-pixel, and a third sub-pixel, and wherein at least one of the metal layers comprises a light shielding metal layer, a gate metal layer, and a source/drain metal layer;
   forming a first reflective anode layer of the first sub-pixel in the same layer as the light shielding metal layer, wherein the first reflective anode layer has a first transparent conductive layer of a first thickness on a side of the first reflective anode layer adjacent to the light emitting layer;
   forming a second reflective anode layer of the second sub-pixel in the same layer as the gate metal layer, wherein the second reflective anode layer has a second transparent conductive layer of a second thickness on a side of the second reflective anode layer adjacent to the light emitting layer; and
   forming a third reflective anode layer of the third sub-pixel in the same layer as the source/drain metal layer, wherein the third reflective anode layer has a third transparent conductive layer of a third thickness on a side of the third reflective anode layer adjacent to the light emitting layer.

4. The method according to claim 3, wherein forming a first reflective anode layer of the first sub-pixel in the same layer as the light shielding metal layer comprises:
   forming a first anode material layer on the base substrate, wherein the first anode material layer comprises a transparent conductive layer of a first thickness on a side of the first anode material layer away from the base substrate;

forming a portion of the first anode material layer into the light shielding metal layer; and forming a portion of the first anode material layer into the first reflective anode layer.

5. The method according to claim 4, further comprising:

forming a buffer layer on the light shielding metal layer, the first reflective anode layer, and a portion of the base substrate; and forming an active layer on a portion of the buffer layer.

6. The method according to claim 5, wherein forming a second reflective anode layer of the second sub-pixel in the same layer as the gate metal layer comprises:

forming a gate insulating material layer on a portion of the active layer and a portion of the buffer layer;

forming a second anode material layer on the gate insulating material layer, wherein the second anode material layer comprises a transparent conductive layer of a second thickness on a side of the second anode material layer facing away from the base substrate;

forming a portion of the second anode material layer into the gate metal layer; and forming a portion of the second anode material layer into the second reflective anode layer.

7. The method according to claim 6, further comprising:

forming an interlayer dielectric layer on the second anode material layer;

forming a first via for connecting source and drain electrodes and the active layer in the interlayer dielectric layer;

forming a second via for connecting the light shielding metal layer and one of the source and drain electrodes in the interlayer dielectric layer;

forming a third via for connecting the first reflective anode layer and one of the source and drain electrodes in the interlayer dielectric layer; and forming a fourth via for connecting the second reflective anode layer and one of the source and drain electrodes in the interlayer dielectric layer.

8. The method according to claim 7, wherein forming a third reflective anode layer of the third sub-pixel in the same layer as the source/drain metal layer comprises:

forming a third anode material layer on the interlayer dielectric layer, wherein the third anode material layer comprising a transparent conductive layer of a third thickness on a side of the third anode material layer facing away from the base substrate;

forming a portion of the third anode material layer into the source/drain metal layer; and forming a portion of the third anode material layer into the third reflective anode layer.

9. The method according to claim 8, further comprising:

forming a passivation layer on the third anode material layer;

forming a pixel defining layer on the passivation layer, wherein the pixel defining layer comprises an opening for disposing an electroluminescent device, the opening is disposed over the first reflective anode layer, the second reflective anode layer, and the third reflective anode layers; and forming on the opening a fifth via for exposing the first reflective anode layer, the second reflective anode layer, and the third reflective anode layer.

10. A display panel, comprising:

an array substrate, wherein the array substrate comprises a plurality of pixel units distributed in an array, each of the pixel units comprising a plurality of sub-pixels, and each of the sub-pixels comprising at least one metal layer and a light emitting layer;

wherein at least one of the sub-pixels further comprises a reflective anode layer formed in the same layer as one of the at least one metal layer, the reflective anode layer having a transparent conductive layer at a side of the reflective anode layer adjacent to the light emitting layer, and transparent conductive layers of at least two different sub-pixels having different thicknesses;

wherein the at least one metal layer comprises: a light shielding metal layer, a gate metal layer, and a source/drain metal layer, the plurality of sub-pixels comprising a first sub-pixel, a second sub-pixel, and a third sub-pixel; and wherein a first reflective anode layer of the first sub-pixel is in the same layer as the light shielding metal layer, a second reflective anode layer of the second sub-pixel is in the same layer as the gate metal layer, and a third reflective anode layer of the third sub-pixel is in the same layer as the source/drain metal layer.

* * * * *